(12) United States Patent
Nittala et al.

(10) Patent No.: US 7,439,898 B1
(45) Date of Patent: Oct. 21, 2008

(54) PARALLEL DIGITAL PROCESSING FOR REDUCING DELAY IN SAR ADC LOGIC

(75) Inventors: Srikanth Nittala, Bangalore (IN);
Jeremy Gorbold, Newbury (GB);
Mahesh Madhavan, Bangalore (IN)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 11/755,761

(22) Filed: May 31, 2007

(51) Int. Cl.
*H03M 1/34* (2006.01)

(52) U.S. Cl. ...................... 341/163; 341/155
(58) Field of Classification Search .......... 341/144–165
See application file for complete search history.

(56) References Cited

U.S. PATENT DOCUMENTS

| | | | |
|---|---|---|---|
| 5,675,340 A * | 10/1997 | Hester et al. | 341/156 |
| 6,809,674 B1 * | 10/2004 | Ramsden | 341/155 |
| 6,950,047 B1 * | 9/2005 | Piasecki et al. | 341/131 |
| 6,958,722 B1 * | 10/2005 | Janakiraman et al. | 341/161 |
| 7,023,372 B1 * | 4/2006 | Singh et al. | 341/155 |

* cited by examiner

*Primary Examiner*—Lam T Mai
(74) *Attorney, Agent, or Firm*—Kenyon & Kenyon LLP (57) ABSTRACT

The analog-to-digital for converter (ADC) for converting an analog value into a digital equivalent using a parallel digital data path is disclosed. In one example embodiment, the ADC includes a switched capacitor DAC having an input to receive an analog value via analog sample and hold circuit. A comparator is coupled to the switched capacitor DAC. A successive approximation register (SAR) is coupled to the comparator. A plurality of logic blocks is coupled to the SAR. A plurality of thermometric encoders is coupled to the associated plurality of logic blocks. A plurality of MUXs is coupled to the associated plurality of thermometric encoders and the comparator, wherein the plurality of MUXs having associated outputs that is coupled to the input of the switched capacitor DAC.

18 Claims, 5 Drawing Sheets

PARALLEL DIGITAL PROCESSING FOR REDUCING DELAY IN SAR ADC LOGIC

FIELD OF TECHNOLOGY

This disclosure relates generally to an analog-to-digital converter (ADC) and, more particularly, to a successive approximation (SAR) ADC.

BACKGROUND

In a traditional SAR ADC a switched capacitor DAC is coupled to a comparator having an output coupled to a successive approximation register controlling non-overlapping switch drivers coupled to the switched capacitor DAC. An analog input sample-and-hold is provided, which may be switched capacitor DAC itself, with the overall SAR ADC being controlled by a controller, such as a state machine.

In operation, the capacitor DAC output is switched to ground and the capacitors are all simultaneously connected to and charged to the analog input voltage in the analog input sample-and-hold circuit. Then the grounding is removed and each capacitor is coupled to a reference voltage, one at a time, starting from the most significant bit (MSB). Typically, the capacitance representing the least significant bit (LSB) is replicated so that the capacitance of the MSB is equal to the sum of all the rest of the capacitances. Thus, when the switch drivers connect the capacitance associated with the MSB to the reference voltage, the comparator will reverse state if the analog input voltage is less than half the reference voltage Vref, but will not reverse state if it is more than half of the Vref. If the comparator does reverse state, then the non-overlapping switch driver associated with the MSB is reset. In any event, the comparator output will remain or return to its original state.

Then the non-overlapping switch driver is set, and left set if the output of the converter does not change, or reset if the output of the comparator does change, again after which the comparator will remain or return to its original state again. This sequence is repeated until the LSB is tested, after which latches in the SAR controlling the non-overlapping switch drivers will contain the digital value of the analog input signal held in the analog input sample-and-hold. Each latch in SAR is set before the respective switch driver is initiated, and if the comparator output changes state, each latch must be reset before the switch drivers are themselves reset. In addition, the output of successive approximation register may go through a thermometric encoder to improve differential-non-linearity (DNL) in the outputted data before being applied to the switched capacitor DAC. For example, a typical 5 to 31 segmented thermometric encoder along with the SAR register in a 0.35 micron process can introduce a delay of about 3 nanoseconds.

It can be seen from the above operation that the digital path in SAR ADC is normally limited by the sum of the delays introduced through the switched capacitor DAC, comparator, the successive approximation register, and the thermometric encoder. Such delays can be substantial, especially, when the sequence is repeated in a non-overlapping fashion for each successive bit in each multiple bit conversion. Any such delays in the digital path of serial SAR ADCs can significantly affect data throughput rate.

BRIEF DESCRIPTION OF THE DRAWINGS

Example embodiments are illustrated by way of example and not limitation in the figures of the accompanying drawings, in which like references indicate similar elements and in which.

Other features of the present embodiments will be apparent from the accompanying drawings and from the detailed description that follows.

DETAILED DESCRIPTION

The device for converting an analog value into a digital equivalent using an analog to digital converter having a parallel digital path is disclosed. In the following description, for purposes of explanation, numerous specific details are set forth in order to provide a thorough understanding of the various embodiments. It will be evident, however, to one skilled in the art that the various embodiments may be practiced without these specific details.

The terms ADC and SAR ADC are used interchangeably throughout the document. In a binary coded switched capacitor DAC, the capacitor values are in a binary sequence. However, the present invention is also applicable to reduced radix and mixed radix DACs. Accordingly, in the description to follow, the reference to a bit, unless the context indicates otherwise, refers to an internal bit of the ADC, which may or may not have a binary weighting, as in well known in the art.

Figure 1:
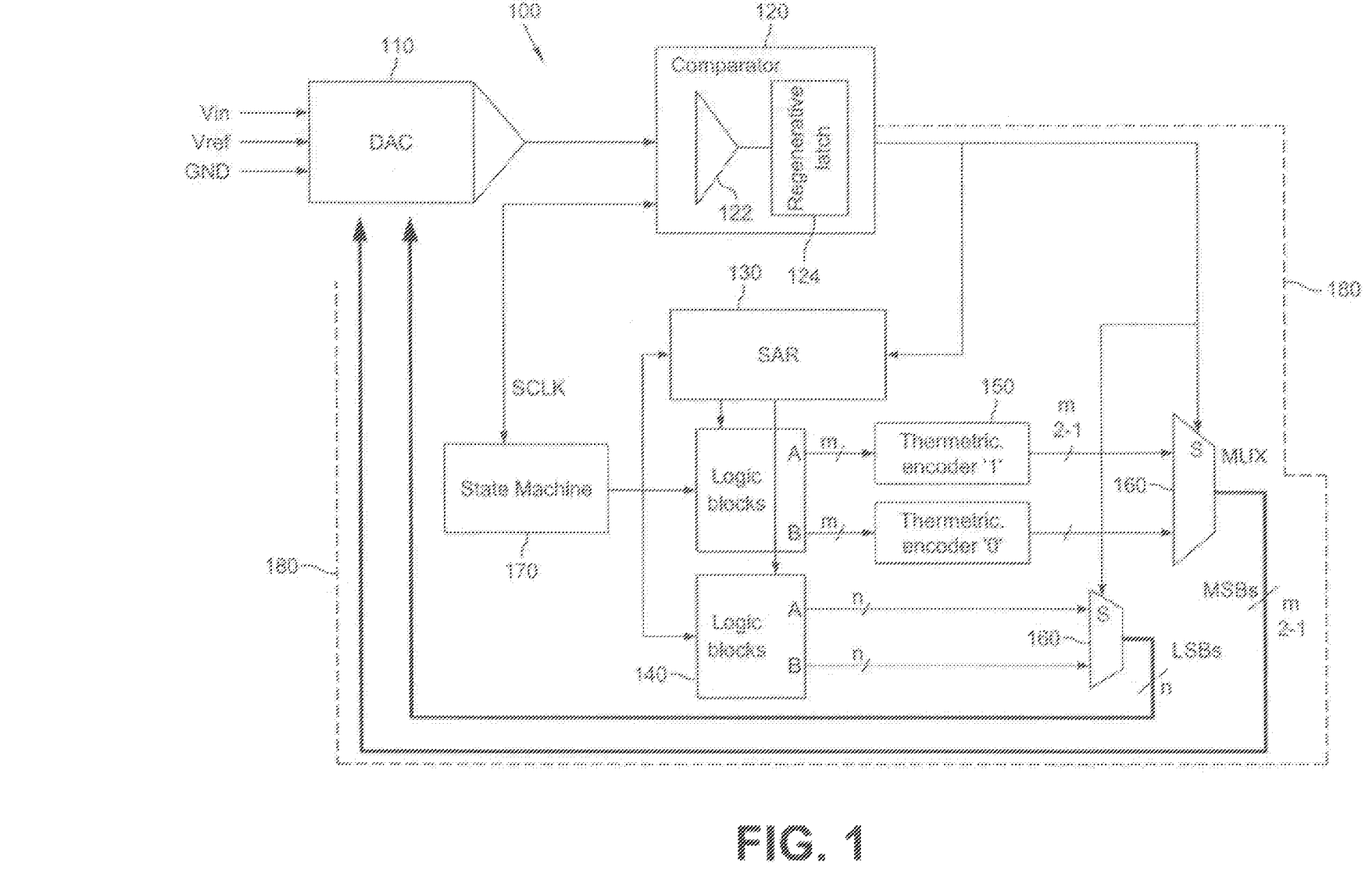
FIG. 1 is a schematic diagram of a SAR ADC including a parallel digital processing data-path according to one embodiment of the present subject matter.

FIG. 1 schematically illustrates an example successive approximation analog to digital converter (SAR ADC) 100 that uses parallel processing technique of the present subject matter to significantly reduce delay in the digital data path. The new digital data path 180 is shown in dotted line in FIG. 1. As shown in FIG. 1, the SAR ADC 100 includes a switched capacitor DAC 110, a comparator 120, a SAR 130, a pair of logic blocks 140, a pair of thermometric encoders 150, a pair of MUXs 160, and a controller 170. In some embodiments, the comparator 120 is a pre-amplifier. Even though for simplicity only a pair of logic blocks 140, a pair of thermometric encoders 150 and a pair of MUXs 160 are shown in FIG. 1, one can envision that the SAR ADC 100 shown in FIG. 1 can work with a plurality of logic blocks 140, a plurality of thermometric encoders 150 and a plurality of MUXs 160 that is based on the number of bits being processed by the SAR ADC 100.

Further as shown in FIG. 1, the comparator 120 includes a pre-amplifier 122 and a regenerative latch 124. It can be seen in FIG. 1 that the digital data outputted from the comparator 120 goes directly to MUXs 150 and then back to the switched capacitor DAC 170 and this technique has only the delay introduced by the MUXs.

In some embodiments, the switched capacitor DAC 110 shown in FIG. 1 is any ordinary or non-differential DACs. In the example embodiment shown in FIG. 1, the digital data path, shown in dotted line 180 does not go through the SAR and the thermometric encoders and hence increasing the speed of operation of ADC 100. Thus, the output of the comparator is coupled to both the SAR and the MUXs to create a parallel path for processing the digital data outputted by the comparator to increase the speed of operation of ADC 100.

In operation, the analog input signal inputted into the switched capacitor DAC 110 during input acquisition and during conversion, DAC output is applied to the comparator 120. The comparator 120 along with the regenerative latch 124 outputs either a "0" or "1" upon receiving the DAC output along with a strobe signal generated from clock signal SCLK. As shown in FIG. 1, the digital data outputted by the comparator 120 then goes to the SAR 130 and gets applied to thermometric encoders 150 via logic blocks 140.

In these embodiments, analog input signal is inputted into the DAC 100 during sampling acquisition. Both the outputs labeled A and B of the logic blocks 140 corresponding to MSB are set to logic state 1 and are set to logic state 0 for rest of the bits before conversion starts. When the conversion starts, during a first bit trial (logic state 1 of the state machine, such as the Johnson counter 170 shown in FIG. 1) the inputted analog input signal is compared to Vref/2 and the comparator 120 outputs either a 0 or 1 based on the outcome of the comparison. The logic blocks 140 associated with the MSB bits are enabled and the outputs of A and B, i.e., 1 and 0 are applied to 5 to 31 segments of thermometric encoder 150 (i.e., for a 5 bit encoder) before the comparator 120 outputs the result. Also, the logic blocks 140 associated with the MSB-1 bit is also addressed to set and outputs of A and B, i.e., 1 and 1, respectively, is applied to the 5 to 31 segments thermometric encoder 150 before the comparator 120 outputs the result. This can ensure that only one of the outputs of A and B, i.e., 1 or 0 is inverted when the logic block 140 is enabled. Substantially simultaneously the output of the associated thermometric encoder 150 is ready.

According to an embodiment, during a first/current bit trial the logic blocks are such that the outputs A and B of a plurality of logic blocks 140 forms two possible SAR register outputs for the second/next bit trial, which is subsequently multiplexed once the comparator 120 has made a decision. For example, when using a three bit parallel path logic block, its operation can be as follows:

In the following example, parallel path '0' indicates SAR out if current bit trial =0 and parallel path '1' indicates SAR out if current bit trial=1.

Parallel paths generated during first (MSB) bit trial (i.e., before a first bit is decided by the comparator 120)

Parallel path '0': MSB, MSB-1, LSB=0 (possible regenerative latch output), 1(next bit set), 0(bit trial not yet started)

Parallel paths '1': MSB, MSB-1, LSB=1(possible regenerative latch output), 1(next bit set), 0(bit trial not yet started)

Assuming first bit=1, parallel paths generated during second (MSB-1) bit trial will be:

Parallel path '0': MSB, MSB-1, LSB=1(data stored in SAR), 0(possible regenerative latch output), 1(next bit set)

Parallel path '1': MSB, MSB-1, LSB=1(data stored in SAR), 1(possible regenerative latch output), 1(next bit set)

Assuming second bit=0, Parallel paths generated during third (LSB) bit trial

Parallel path '0': MSB, MSB-1, LSB=1(data already stored in SAR), 0(data stored in SAR), 0(possible regenerative latch output)

Parallel path '1': MSB, MSB-1, LSB=1(data already stored in SAR), 0(data stored in SAR), 1(possible regenerative latch output)

Once the comparator 120 outputs the data, one of the thermometric encoders 150 outputs the data to associated MUX 160, which is then multiplexed to switch drivers of DAC 110, also, upon the regenerative latch output is stored in MSB logic block of SAR; it is made transparent to the thermometric encoder input through the corresponding MSB logic block A and B outputs for a next bit trial.

Similarly, for a second bit trial before the comparator 120 makes the decision, one more logic block 140 corresponding to MSB-1 bit is enabled to provide the preset data of 1 and 0 to the thermometric encoders 150. Also, the logic block 140 associated with the MSB-2 bit is also addressed to set outputs A and B, i.e., 1 and 1 and are applied to 5 to 31 segments of thermometric encoder 150 before the comparator 120 outputs the result. This process repeats itself for each of the remaining bits associated with the inputted analog signal.

In these embodiments, before the regenerative latch 124 in the comparator 120 outputs either a '0' or '1' the plurality of thermometric encoders 150 are set to '0' and '1' and encode the MSB bits so that the otuput at the plurality of thermometric encoders 150 are ready and waiting at the associated plurality of MUXs 160. Either one of the encoded data waiting at the plurality of thermometric encoders 150 is selected and outputted by the plurality of MUXs 160 upon receiving the digital data from the regenerative latch 124. Basically, the plurality of thermometric encoders 150 starts encoding the data while the regenerative latch 124 is being strobed using the SCLK signal.

In these embodiments, the plurality of logic blocks 140 is substantially equal to number of bits. For example, if an ADC has 12 bits, then 5 MSB bits are applied to the thermometric encoder 150 to segment them in to ($2^5$–1) 31 segments and the 7 LSB bits are directly applied to the MUXs. In these embodiments, segmenting the bits may help improve DNL and settling time. Further in these embodiments, top 5 MSB bits are segmented using the two thermometric encoders 150, as shown in FIG. 1, by assuming the comparator 120 output as "1" and "0". It can be seen that 5 logic blocks having A and B outputs are required in order to preset the 5 MSB bits. Also it can be seen in FIG. 1 that the parallel digital path 180 bypasses the delay introduced by the SAR 130 and the two thermometric encoders 150. Further, it can be seen in FIG. 1 that for the remaining 7 LSB bits the delay introduced by the SAR 130 is bypassed. In these embodiments, the regenerative latch makes a decision any time during its allotted time and depending on its input (pre-amplifier output) difference to send data to the MUX 160 to select input 130 and it does not wait for the completion of its allotted time to send the data to SAR 130 as in the conventional SAR ADCs. The regenerative latch 124 output in the SAR ADC 100 of the present subject matter using parallel digital path 180 can be applied to the DAC 110 through the MUX 160 without waiting for its allotted time. Therefore, it can be seen that the delay in LSB bit trials is also reduced. As shown in FIG. 1, 'm' represents a number of MSB bits that are segmented and 'n' represents a number of LSB bits that are not segmented. Sometimes thermometric encoder 150 may be used in some of the LSB bits if the DAC 110 is divided into two units with some coupling in between the divisions. Even in these embodiments, the above described can be used to reduce delay in LSB bits.

Figure 2:
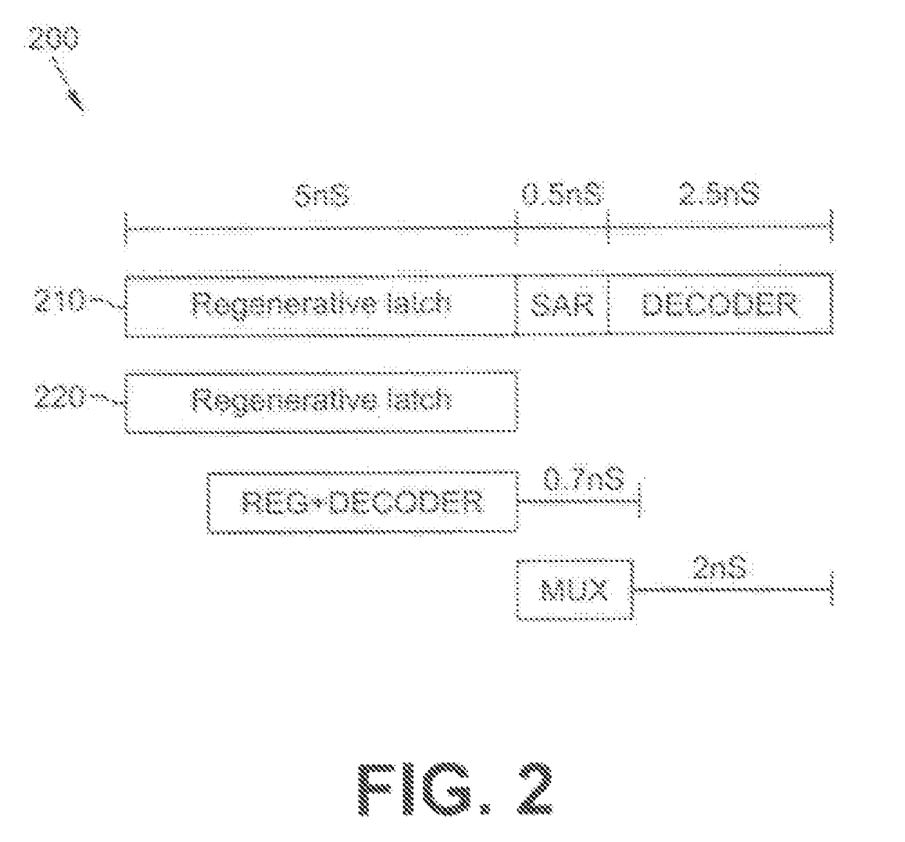
FIG. 2 is an example timing diagram that illustrates the difference in critical path timing required for data to travel from comparator back to switched capacitor DAC when using conventional SAR ADC and the SAR ADC of the present subject matter, such as those shown in FIG. 1.

FIG. 2 is an example timing diagram that shows the difference in digital data path timing between the conventional SAR ADC 210 and the parallel processing SAR ADC 220 of the present subject matter. These example times are obtained using 5 bit thermometric encoder with a SAR register made using 0.35 micron process. It can be seen that the conventional SAR ADC has nearly 2.8 nanoseconds delay whereas as the parallel processing SAR ADC of the present subject matter has only about 0.7 nanoseconds. The SAR ADC of the present subject matter, such as those shown in FIGS. 1 and 3, yield about 2 nanoseconds reduction in critical data path travel time. Further improvement in performance can be achieved by using the regenerative latch 124 output in MUX whenever the decision by the comparator 120 is outputted, without waiting for the designated time. Generally, the designated time is usually set by a timer using the CLK.

Figure 3:
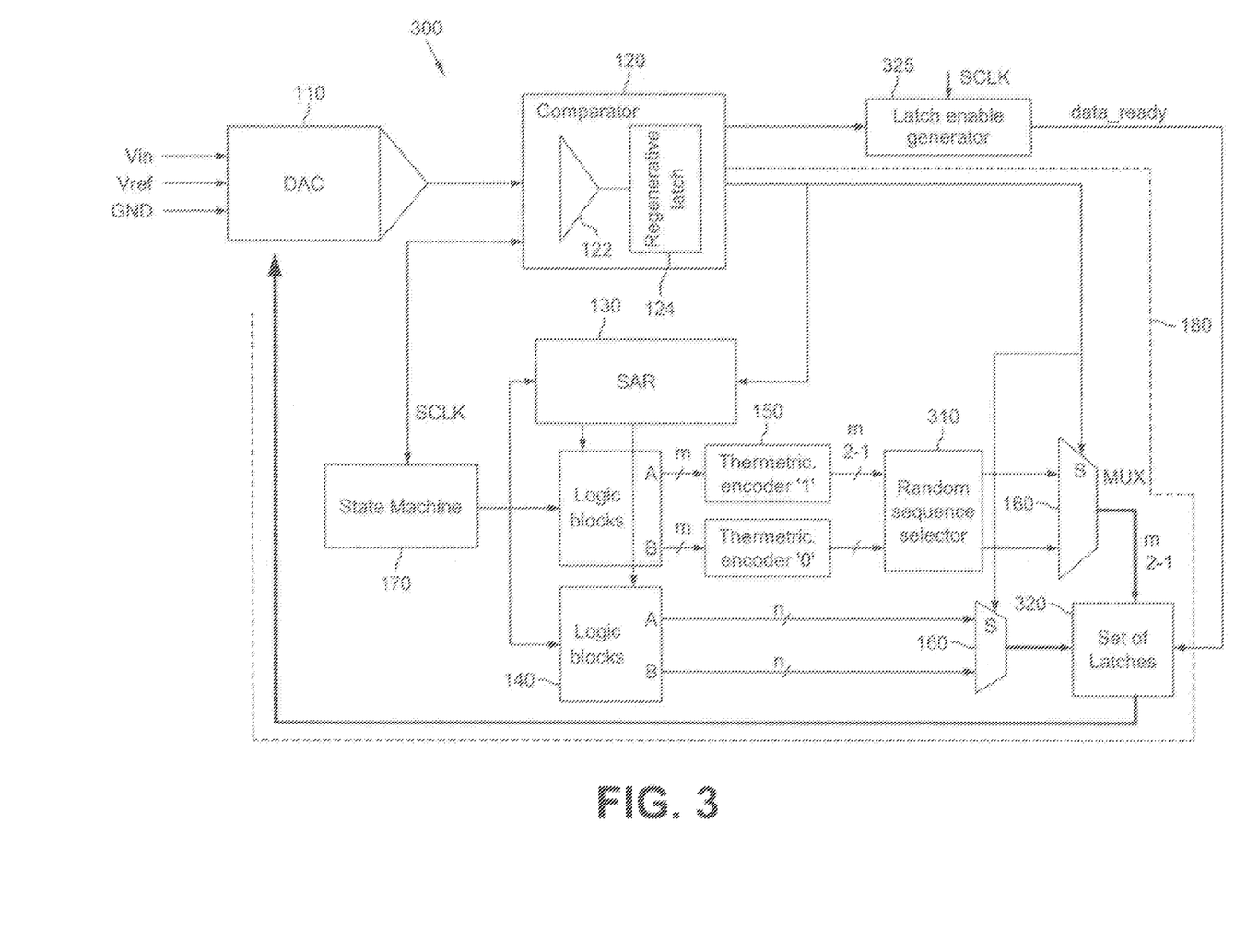
FIG. 3 is a schematic diagram of a SAR ADC including a parallel digital processing data-path according to another embodiment of the present subject matter.

FIG. 3 schematically illustrates another example successive approximation analog to digital converter (SAR ADC) 300 that uses parallel processing technique of the present subject matter to significantly reduce delay in the digital data path. Further, the SAR ADC 300 shown in FIG. 3 includes logic to enable selecting different capacitor switching sequences randomly without affecting the reduced delay achieved with the SAR ADC 100 shown in FIG. 1. It can be seen that the digital data path 180 shown in FIG. 3 is similar to the digital data path shown in FIG. 1. Also, it can be seen that the circuit shown in SAR ADC 300 is similar to the circuit of SAR ADC 100 shown in FIG. 1 except that it has a random sequence selector 310 that is coupled between the plurality of thermometric encoders 150 and the MSB MUX 160 and a set of latches 320 that is coupled between the plurality of MUXs 160 and the switched capacitor DAC 110. The random sequence selector 310 can be a mismatch noise shaper or any other processing circuit that performs substantially similar function. Further as shown in FIG. 3, the SAR ADC 300 has a latch enable generator 325 that is coupled between the pre-amplifier 120 and the set of latches 320. In some embodiments, the latch enable generator generates a signal so that the data from the comparator 120 by passes the set of latches 320 are in available to the DAC110. This can ensure adding the additional set of latches 320 do not cause any delay in the SAR digital data path 180.

The outputs of the plurality of MUXs 160 are latched by the set of latches 320 to avoid any glitches at the switched capacitor DAC 110. This can significantly reduce the glitches in the DAC output. Also, such latching by the set of latches 320 can enable in starting the parallel processing substantially ahead to improve the performance of the SAR ADC 300 shown in FIG. 3. In these embodiments, the parallel processing starts upon a rising edge of SCLK signal. In contrast, the SAR ADC 100 shown in FIG. 1 starts upon the falling edge of the SCLK signal along with the regenerative latch 124. It can be seen that the SAR ADC 300 provides substantially more time for parallel processing in addition to adding randomizing switching sequences. Also, it can be seen that the thermometric encoding for a current bit trial can be started in the previous bit trial as shown in the timing diagram FIG. 4. Further, it can be seen that the data_ready signal in FIG. 3 enables the latch whenever the data is ready from the regenerative latch 124, so that its input to output delay is not added to the total digital path delay.

Figure 4:
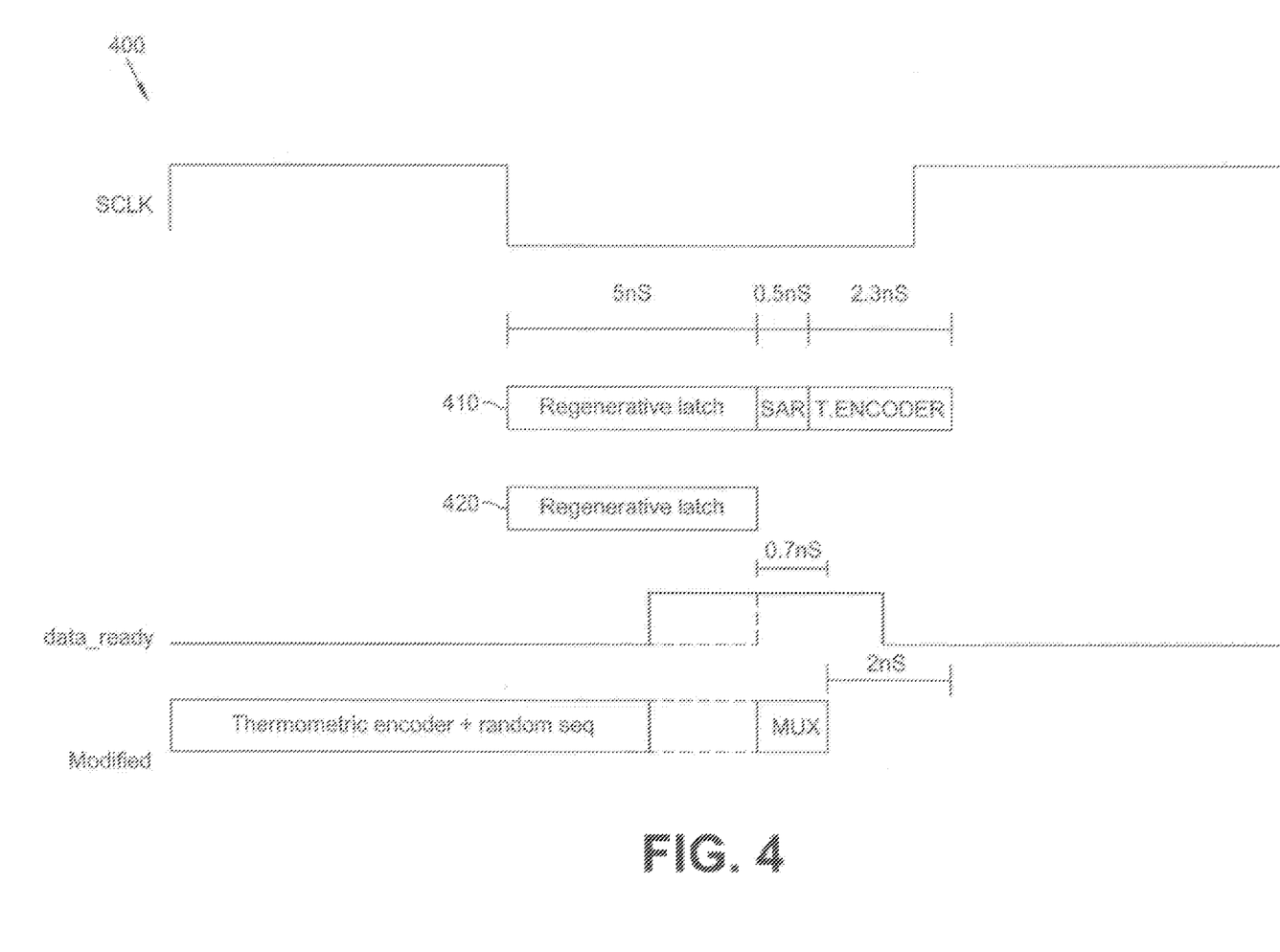
FIG. 4 is an example timing diagram that illustrates the difference in critical path timing required for data to travel from comparator back to switched capacitor DAC when using the conventional SAR ADC and the SAR ADC of the present subject matter, such as those shown in FIG. 3.

Furthermore it can be seen in FIG. 4, that the parallel path starts upon the rising edge of the SCLK signal. Moreover, the data_ready signal shows that the regenerative latch 124 has completed its decision. Typically, the regenerative latch 124 does not take the complete 5 nanoseconds to complete the decision. However, in some embodiments, bit trials require all the 5 nanoseconds to complete the decision. In such a situation, the data_ready signal is available at substantially end of the regenerative latch period. This portion of the regenerative latch period, where the data_ready signal's rising edge can appear, is shown in dotted lines in FIG. 4. It can also be seen in FIG. 4, that when the data_ready signal is high the set of latches 320 is transparent and hence only the MUX 160 delay is seen in the digital data path 180.

Even though, the above technique is described with reference to using random sequence selector, it can be envisioned that any other kind of processing can be used to improve INL profile as well as to reduce DNL from capacitor mismatches. It can also be envisioned that even though using the random sequence selector 310 introduces some delay in the digital data path 180, by using the parallel digital data processing of the present subject matter, this delay can be bypassed and can get the benefit of reducing the mismatch errors introduced by the capacitor. The above technique reduces SAR logic delay and significantly improves ADC throughput.

Figure 5:
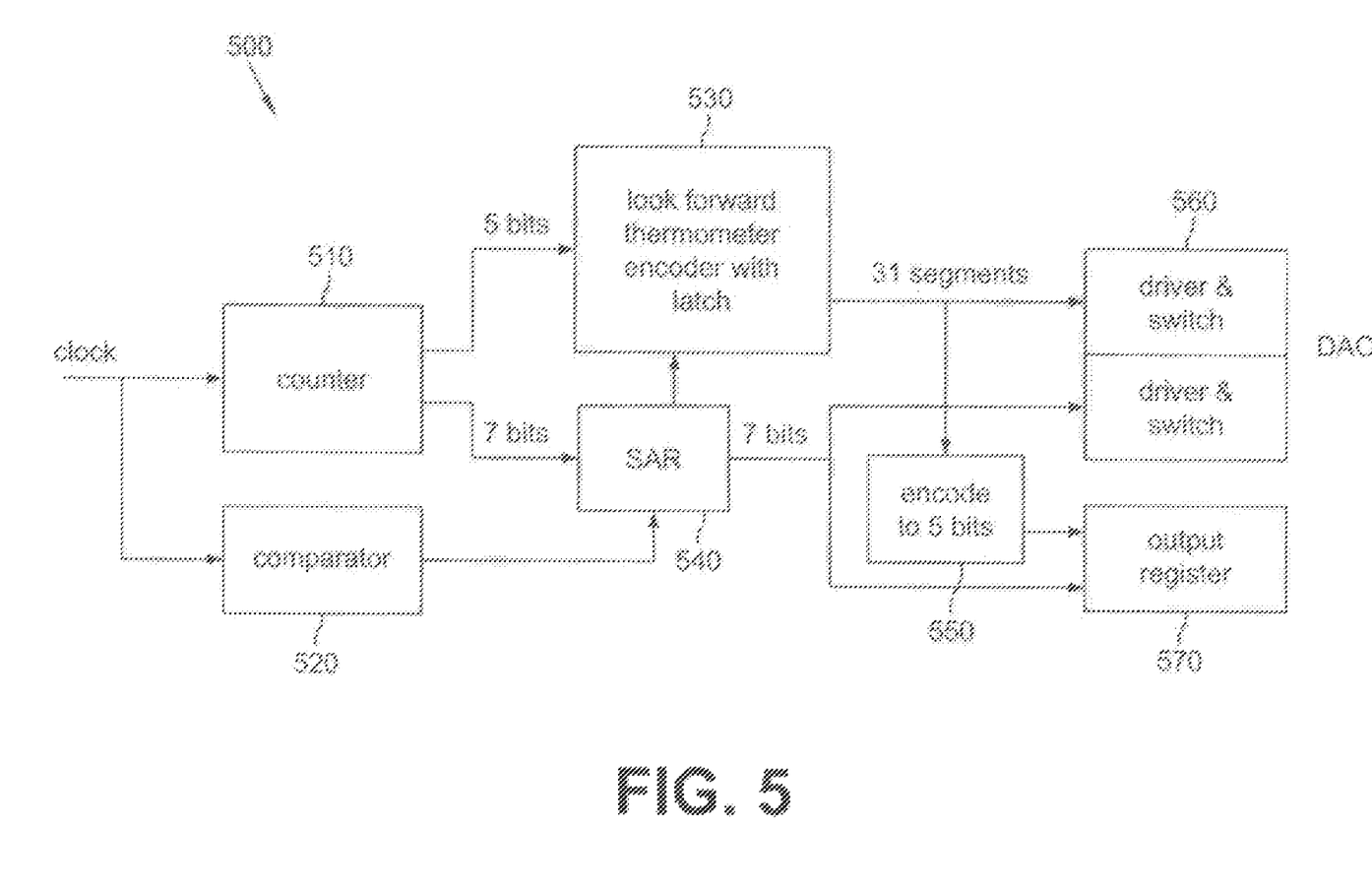
FIG. 5 is a schematic diagram of a SAR ADC including a parallel digital processing data-path according to another embodiment of the present subject matter.

FIG. 5 schematically illustrates example SAR ADC 500 including parallel digital processing scheme according to another embodiment of the present subject matter that uses a modified digital data path for the 5 MSB bits to achieve a reduced delay in the digital data path. As shown in FIG. 5, the SAR ADC 500 includes a counter 510, a comparator 520, a look forward thermometric encoder with associated latch 530, a SAR 540, a thermometric encoder 550, a pair of drivers and switches 560 and an output register 570. In some embodiments, the counter 510 can be state machine. The term "look forward" means the segments thermometric elements for a next bit trial (i.e., $n+1^{th}$ bit trial) are addressed (being determined and conveyed through the logic chain) in the current bit trial (i.e., $n^{th}$ bit trial). In these embodiments, the slow bit is converted in advance of needed information, i.e., at the start of the bit trial.

In operation, an analog input signal is inputted into DAC during sampling/acquisition. Upon a rising edge of the clock signal CLK, the conversion of the inputted analog signal is started during first bit trial. Substantially simultaneously, outputs are set high on previously addressed look forward thermometric encoder 530 and binary encoder 550. The next potential outputs are addressed on the look forward thermometric encoder 530 and the thermometric encoder 550. The DAC is allowed to settle during the remaining clock period. The comparator 510 is then strobed during the clock cycle and the 5 MSB bits and the remaining 7 LSB bits are latched at output of the associated look forward thermometric encoder 530 and the binary encoder 550.

In the above technique there is no SAR 540 for the MSBs for the bits that are significantly different. Further, the latching is done at the output of the look forward thermometric encoder 530 and the binary encoder 550. The slow path through the thermo metric encoder is the addressing of the new bit, which is done while a present bit is being trialed.

The following table illustrates the working of the above technique using a three bit example

| MSB trial | preaddr | MSB-1 trial | preaddr | MSB-2 trial | preaddr | latched at end. | |
|---|---|---|---|---|---|---|---|
| | | | | 1111111 | X111111 | 1111111 | keep |
| | | 0111111 | XX11111 | | | 0111111 | throw |
| | | | | 0011111 | 00X1111 | 0011111 | keep |
| 0001111 | 0XXXX11 | | | | | 0001111 | throw |
| | | | | 0000111 | 0000X11 | 0000111 | keep |
| | | 0000011 | 0000XX1 | | | 0000011 | throw |
| | | | | 0000001 | 000000X | 0000001 | keep |
| | | | | | | 0000000 | throw |

The above description is intended to be illustrative, and no restrictive. Many other embodiments will be apparent to those skilled in the art. The scope of the subject matter should therefore be determined by the appended claims, along with the full scope of equivalents to which such claims are entitled.

As shown herein, the present subject matter can be implemented in a number of different embodiments, including various methods and circuits. Other embodiments will be readily apparent to those of ordinary skill in the art. The elements, algorithms, and sequence of operations can all be varied to suit particular requirements.

FIGS. 1-5 are merely representational and are not drawn to scale. Certain proportions thereof may be exaggerated, while others may be minimized. FIGS. 1-5 illustrate various embodiments of the subject matter that can be understood and appropriately carried out by those of ordinary skill in the art.

In the foregoing detailed description of the embodiments of the invention, various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive invention lies in less than all features of a single disclosed embodiment. Thus, the following claims are hereby incorporated into the detailed description of the embodiments of the invention, with each claim standing on its own as a separate preferred embodiment.

What is claimed is:

1. A successive approximation analog to digital converter (SAR ADC) comprising:
   a DAC having an input;
   a comparator coupled to the switched capacitor DAC;
   a successive approximation register (SAR) coupled to the comparator;
   a plurality of logic blocks coupled to the SAR;
   a plurality of thermometric encoders coupled to the associated plurality of logic blocks, and
   a plurality of MUXs coupled to the associated plurality of thermometric encoders and the comparator, wherein the plurality of MUXs having associated outputs that is coupled to the input of the switched capacitor DAC.

2. The SAR ADC of claim 1, wherein the DAC is selected from the group consisting of a switched capacitor DAC, a differential switched capacitor DAC, and a resistor DAC.

3. The SAR ADC of claim 1, wherein the plurality of logic blocks comprises a MSB logic block and a LSB logic block.

4. The SAR ADC of claim 1, wherein the plurality of MUXs comprise a MSB MUX and a LSB MUX, and wherein the MSB MUX is coupled between the plurality of thermometric encoders and the switched capacitor DAC and the LSB MUX is coupled between the LSB logic block and the switched capacitor DAC.

5. The SAR ADC of claim 1, further comprising a controller coupled to the SAR to provide control signals.

6. The SAR ADC of claim 5, wherein the controller is a state machine.

7. The SAR ADC of claim 1, wherein the plurality of logic blocks are NOR gate based latches.

8. The SAR ADC of claim 1, wherein the plurality of logic blocks are NAND gate based latches.

9. The SAR ADC of claim 1, wherein the switched capacitor DAC comprises a DAC selected from the group consisting of a binary coded DAC, a reduced radix DAC and a mixed radix DAC.

10. A SAR ADC comprising:
    a switched capacitor DAC having an input;
    a comparator coupled to the switched capacitor DAC;
    a successive approximation register (SAR) coupled to the comparator;
    a plurality of logic blocks coupled to the SAR;
    a random sequence selector coupled to the plurality of logic blocks;
    a plurality of thermometric encoders coupled to the random sequence selector;
    a plurality of MUXs coupled to the associated plurality of thermometric encoders and the comparator, wherein the plurality of MUXs having associated outputs that is coupled to the input of the switched capacitor DAC;
    a set of latches coupled between the plurality of MUXs and the switched capacitor DAC; and
    a latch enable generator coupled between the comparator and the set of latches, wherein the set of latches receives inputs from the plurality of MUXs and the latch enable generator.

11. The SAR ADC of claim 10, wherein the DAC is selected from the group consisting of a switched capacitor DAC, a differential switched capacitor DAC, and a resistor DAC.

12. The SAR ADC of claim 10, wherein the plurality of logic blocks comprises a MSB logic block and a LSB logic block.

13. The SAR ADC of claim 12, wherein the plurality of MUXs comprise a MSB MUX and a LSB MUX, and wherein the MSB MUX is coupled between the random sequence selector and the set of latches nd the LSB MUX is coupled between the LSB logic block and the set of latches.

14. The SAR ADC of claim 10, further comprising a controller coupled to the SAR to provide control signals.

15. The SAR ADC of claim 14, wherein the controller is a state machine.

16. A SAR ADC comprising:
a switched capacitor DAC having an input;
a comparator coupled to the switched capacitor DAC;
a state machine coupled to the switched capacitor DAC and wherein the state machine having a MSB output and a LSB output that generates associated state/address signals;
a successive approximation register (SAR) coupled to the comparator and the LSB output of the controller to receive the state/address signals from the state machine;
a look forward thermometric encoder coupled to the MSB output of the controller;
a MSB driver switch coupled between the look forward thermometric encoder and the switched capacitor DAC; and
a LSB driver switch coupled between the SAR and the switched capacitor DAC.

17. The SAR ADC of claim 16, further comprising an output register coupled to the SAR.

18. The SAR ADC of claim 16, wherein the DAC is selected from the group consisting of a switched capacitor DAC, a differential switched capacitor DAC, and a resistor DAC.

* * * * *